(12) United States Patent
Nejime

(10) Patent No.: US 12,130,471 B2
(45) Date of Patent: Oct. 29, 2024

(54) OPTICAL ELEMENT MOUNTING MODULE

(71) Applicant: KYOCERA Corporation, Kyoto (JP)

(72) Inventor: Takayuki Nejime, Ritto (JP)

(73) Assignee: KYOCERA Corporation, Kyoto (JP)

( * ) Notice: Subject to any disclaimer, the term of this patent is extended or adjusted under 35 U.S.C. 154(b) by 204 days.

(21) Appl. No.: 17/780,171

(22) PCT Filed: Oct. 6, 2020

(86) PCT No.: PCT/JP2020/037872
§ 371 (c)(1),
(2) Date: May 26, 2022

(87) PCT Pub. No.: WO2021/106378
PCT Pub. Date: Jun. 3, 2021

(65) Prior Publication Data
US 2022/0413212 A1 Dec. 29, 2022

(30) Foreign Application Priority Data

Nov. 28, 2019 (JP) ................................ 2019-214958

(51) Int. Cl.
*G02B 6/12* (2006.01)
(52) U.S. Cl.
CPC ................ *G02B 6/12004* (2013.01)
(58) Field of Classification Search
CPC ................................................ G02B 6/12004
See application file for complete search history.

(56) References Cited

U.S. PATENT DOCUMENTS

2005/0201693 A1 9/2005 Korenaga et al.
2016/0313517 A1* 10/2016 Yamamoto ............. G02B 6/138
2019/0353842 A1* 11/2019 Yanagisawa ....... G02B 6/12004

FOREIGN PATENT DOCUMENTS

| JP | 2003-315580 A | 11/2003 |
| JP | 2006-042307 A | 2/2006 |
| JP | 2006-234851 A | 9/2006 |
| JP | 2007-199657 A | 8/2007 |
| JP | 2009-037004 A | 2/2009 |
| JP | 2011-044737 A | 3/2011 |
| JP | 2018-163186 A | 10/2018 |

* cited by examiner

*Primary Examiner* — Sung H Pak
(74) *Attorney, Agent, or Firm* — Volpe Koenig

(57) ABSTRACT

An optical element mounting module includes a wiring board including an upper surface and a terminal, an optical waveguide on the upper surface and the terminal, and an optical element on the optical waveguide, including a light emitting/receiving portion having a convex shape and an electrode. The optical waveguide includes a lower cladding layer, a core on the lower cladding layer, an upper cladding layer, a cavity between the upper surface of the upper cladding layer to the lower cladding layer for dividing the core, a through hole passing through the upper to the lower cladding layer to the terminal, and a conductive material in the through hole and connected to the electrode and the terminal. The light emitting/receiving portion includes a first part on the upper cladding layer and a second part between the upper surface of the upper cladding layer and the lower surface of the optical element.

12 Claims, 5 Drawing Sheets

OPTICAL ELEMENT MOUNTING MODULE

TECHNICAL FIELD

The present invention relates to an optical element mounting module.

BACKGROUND ART

In recent years, optical communication networks capable of communicating large amounts of data at high speed have expanded, and various optical communication devices utilizing such optical communication networks exist. Such devices are equipped with an optical wiring module in which an optical waveguide and an optical element are connected to a substrate as described in Patent Document 1, for example.

CITATION LIST

Patent Literature

Patent Document 1: JP 2011-44737 A

SUMMARY

An optical element mounting module according to the present disclosure includes a wiring board including an upper surface and a terminal located on the upper surface, an optical waveguide located on the upper surface and the terminal of the wiring board, and an optical element located on the optical waveguide and including a lower surface and a light emitting or receiving portion located on the lower surface and having a convex shape and an electrode. The optical waveguide includes a lower cladding layer located on the upper surface of the wiring board, a core located on the lower cladding layer, an upper cladding layer covering the lower cladding layer and the core, a cavity located from an upper surface of the upper cladding layer to the lower cladding layer and dividing the core, a through hole passing through the upper cladding layer and the lower cladding layer from the upper cladding layer to the terminal, and a conductive material located in the through hole and connected to the electrode and the terminal of the optical element. The light emitting or receiving portion includes a first part located in the upper cladding layer and a second part located between the upper surface of the upper cladding layer and a lower surface of the optical element.

DESCRIPTION OF EMBODIMENTS

In a case where an optical element is mounted on an optical wiring board including an optical waveguide, for example, the optical element is mounted on an upper surface of the optical waveguide. At this time, two electrodes of the optical element are connected to, for example, terminals on the upper surface of the wiring board by solder in a through hole of the optical waveguide. Thus, it is insufficient for stable fixation of the optical element, and for example, positional deviation of the optical element is likely to occur due to vibration during use or the like. As a result, transmission loss increases, which affects communication.

In the optical element mounting module of the present disclosure, the light emitting or receiving portion of the optical element includes a first part embedded in the upper cladding layer and a second part located between an upper surface of the upper cladding layer and a lower surface of the optical element. Thus, the optical element is stably fixed to the upper cladding layer by both the electrode and the light emitting or receiving portion, and even when vibration or the like occurs during use, positional deviation of the optical element is less likely to occur. As a result, transmission loss can be reduced, and stable communication can be performed. Since there is no gap between the lower surface of the light emitting or receiving portion of the optical element and the upper surface of the optical waveguide, mixing of foreign matter can also be reduced. Furthermore, the distance between the light emitting or receiving portion and a reflective mirror portion of the optical waveguide is also shortened, and thus the loss of light can also be reduced. Not all of the light emitting or receiving portion is embedded in the upper cladding layer, and the optical element mounting module includes a second part located between the upper surface of the upper cladding layer and the lower surface of the optical element. Accordingly, the pressure applied to the reflective mirror portion when the light emitting or receiving portion is embedded can be reduced. As a result, it is possible to reduce a change in an inclination of the reflective mirror portion and reduce transmission loss of light between the optical element and the core.

Figure 1:
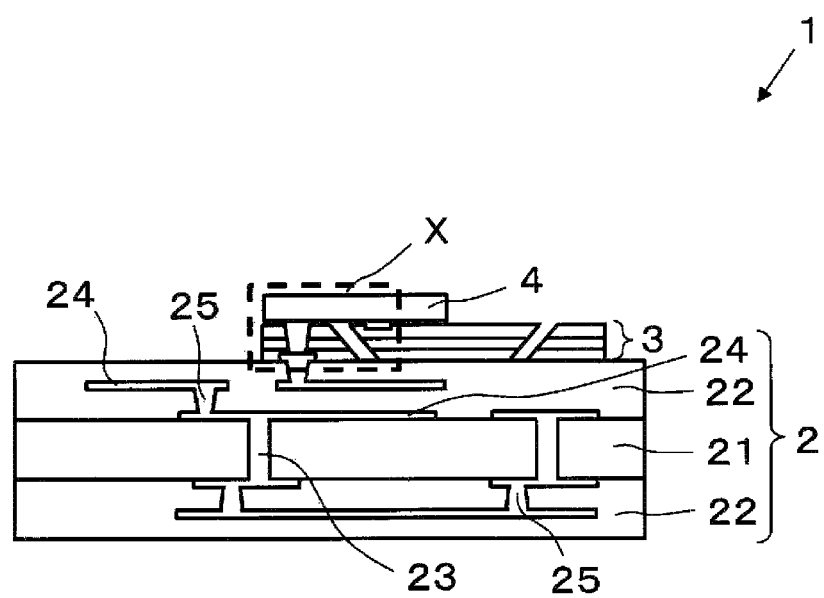
FIG. 1 is an explanatory view illustrating an optical element mounting module according to a first embodiment of the present disclosure.
Figure 2:
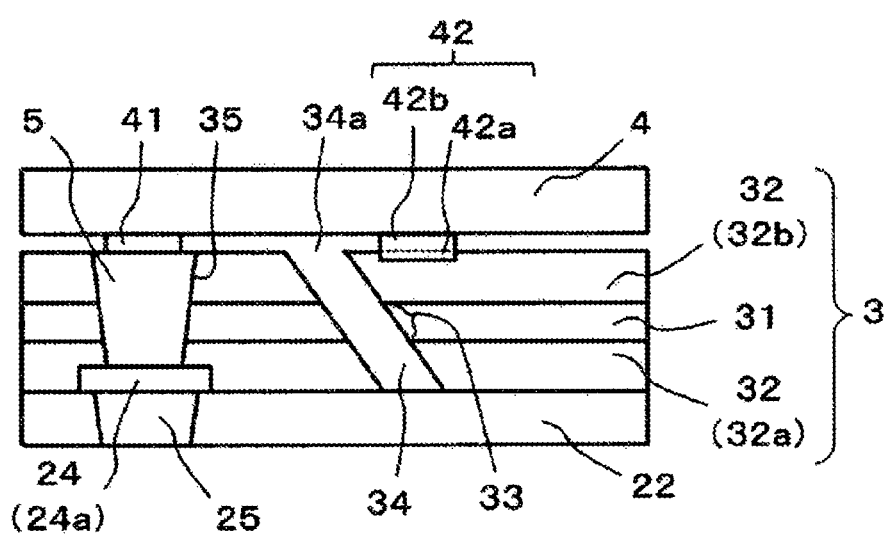
FIG. 2 is an enlarged explanatory view of a region X in the optical element mounting module illustrated in FIG. 1.

An optical element mounting module according to an embodiment of the present disclosure will be described with reference to FIGS. 1 and 2. An optical element mounting module 1 according to the embodiment illustrated in FIG. 1 includes a wiring board 2, an optical waveguide 3, and an optical element 4. The wiring board 2 includes a core substrate 21 and build-up layers 22 layered on both surfaces of the core substrate 21. The core substrate 21 is not particularly limited as long as the core substrate 21 is formed of a material having an insulating property. Examples of the material having an insulating property include resins such as an epoxy resin, a bismaleimide-triazine resin, a polyimide resin, and a polyphenylene ether resin. Two or more of these resins may be mixed and used. The thickness of the core substrate 21 is not particularly limited and is, for example, 100 μm or more and 2000 μm or less.

The core substrate 21 may contain a reinforcing material. Examples of the reinforcing material include insulating fabric materials such as glass fiber, glass non-woven fabric, aramid non-woven fabric, aramid fiber, and polyester fiber. Two or more types of reinforcing materials may be used in combination. Further, an inorganic insulating filler made of, for example, silica, barium sulfate, talc, clay, glass, calcium carbonate, or titanium oxide may be dispersed in the core substrate 21.

A through hole conductor 23 is included in the core substrate 21 to electrically connect the upper and lower surfaces of the core substrate 21 to each other. The through hole conductor 23 is located in a through hole passing through the upper and lower surfaces of the core substrate 21. The through hole conductor 23 is formed of a conductor made of metal plating such as copper plating, for example. The through hole conductor 23 is connected to conductor layers 24 formed on both surfaces of the core substrate 21. A land (not illustrated) may be included in the conductor layers 24. The through hole conductor 23 may cover only the inner wall surface of the through hole, or may fill the inside of the through hole.

The build-up layers 22 are layered on both surfaces of the core substrate 21. In the optical element mounting module 1 according to the embodiment illustrated in FIG. 1, the structure of each of the build-up layers 22 is not illustrated in detail. The build-up layer 22 may have a structure in which at least one insulating layer and at least one conductor layer 24 are alternately layered.

As with the core substrate 21, the insulating layer included in the build-up layer 22 is not particularly limited as long as the insulating layer is formed of a material having an insulating property. Examples of the material having an insulating property include resins such as an epoxy resin, a bismaleimide-triazine resin, a polyimide resin, and a polyphenylene ether resin. Two or more of these resins may be mixed and used. When two or more insulating layers are present in the build-up layer 22, the respective insulating layers may be formed of the same resin or may be formed of different resins. The insulating layers included in the build-up layer 22 and the core substrate 21 may be formed of the same resin or may be formed of different resins.

Further, an inorganic insulating filler made of, for example, silica, barium sulfate, talc, clay, glass, calcium carbonate, or titanium oxide may be dispersed in the insulating layer included in the build-up layer 22. The thickness of the insulating layer included in the build-up layer 22 is not particularly limited and is, for example, 5 µm or more and 100 µm or less. When two or more insulating layers are present in the build-up layer 22, the respective insulating layers may have the same thickness or may have different thicknesses.

A via hole conductor 25 for electrically connecting the layers is included in the insulating layer included in the build-up layer 22. The via hole conductor 25 is located in a via hole passing through the upper and lower surfaces of the insulating layer included in the build-up layer 22. The via hole conductor 25 is formed of a conductor made of metal plating such as copper plating, for example. The via hole conductor 25 is connected to the conductor layers 24 located via the insulating layer included in the build-up layer 22. A land (not illustrated) may be included in the conductor layers 24. The via hole conductor 25 may cover only the inner wall surface of the via hole, or may fill the inside of the via hole. A terminal 24a serving as a part of the conductor layer 24 and to be electrically connected to the optical element 4 is located on the upper surface of the wiring board 2.

The optical waveguide 3 is located on the upper surface of the wiring board 2. As illustrated in FIG. 2, the optical waveguide 3 includes a core 31, cladding layers 32, a reflective mirror portion 33, a cavity 34, and a through hole 35.

The core 31 included in the optical waveguide 3 acts as an optical path, and light entering the optical waveguide 3 passes through the core 31. The material of the core 31 is not limited, and is appropriately set in consideration of, for example, permeability to light, the wavelength characteristics of light passing through the core 31, and the like. The refractive index of the resin forming the core 31 is greater than the refractive index of the resin forming the cladding layers 32. The light in the core 31 is transmitted while repeating refraction at the boundary between the core 31 and the cladding layers 32. Examples of the material include an epoxy resin and a silicone resin. The core 31 may have a thickness of, for example, 20 µm or more and 40 µm or less.

The cladding layers 32 included in the optical waveguide 3 are located so as to cover the core 31. In the optical waveguide 3 illustrated in FIG. 2, the cladding layer 32 closer to the wiring board 2 side is a lower cladding layer 32a, and the cladding layer 32 closer to the other side (the optical elements 4 side) is an upper cladding layer 32b. The material of the cladding layers 32 is not limited, and examples thereof include an epoxy resin and a silicone resin. The cladding layers 32 may have a thickness of, for example, 5 µm or more and 60 µm or less. The lower cladding layer 32a and the upper cladding layer 32b may have the same thickness or may have different thicknesses.

The reflective mirror portion 33 included in the optical waveguide 3 is a divided surface of the core 31 divided by the cavity 34 passing through the upper cladding layer 32b, the core 31, and the lower cladding layer 32a in the thickness direction. The reflective mirror portion 33 is not parallel to the thickness direction of the optical waveguide 3, but is inclined with respect to the thickness direction. The inclination angle is appropriately set in accordance with the shape or the like of the optical element 4. The angle formed by the core 31 and the reflective mirror portion 33 is, for example, approximately 40° or more and 50° or less. The cavity 34 is not filled with a resin or the like and air is present therein. This is because, since the refractive index of air is small, the difference between the refractive index of air and the refractive index of the core 31 is large, which is convenient for light to be refracted at the reflective mirror portion 33.

The through hole 35 included in the optical waveguide 3 is located from the upper surface of the upper cladding layer 32b to the terminal 24a. The through hole 35 includes, for example, a solder 5 for connecting the terminal 24a and an electrode 41 of the optical element 4 to each other. The through hole 35 is formed by, for example, laser machining.

Figure 3:
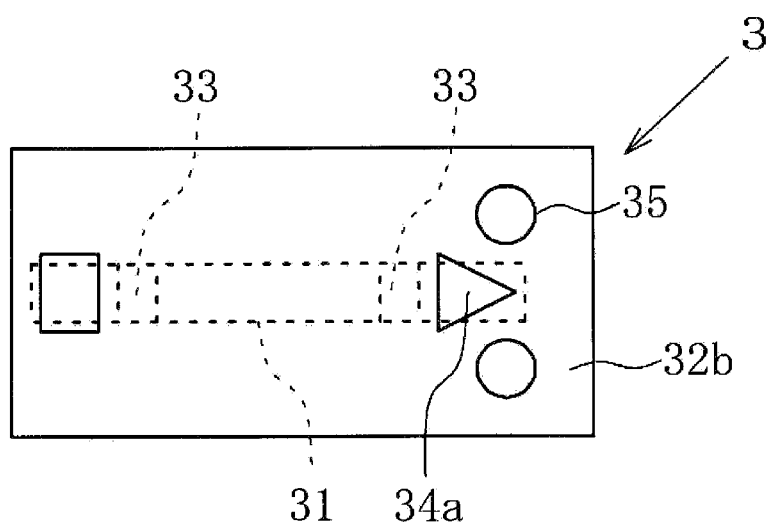
FIG. 3 is a plan view illustrating an optical waveguide portion in FIG. 1.

The shape of an opening portion 34a of the cavity 34, that is, the opening shape in plan view from the upper cladding layer 32b is not particularly limited. The opening portion 34a may have, for example, a polygonal shape such as a triangular shape, a quadrilateral shape, a pentagonal shape, or a hexagonal shape (the polygonal shape includes a polygonal shape in which each vertex is rounded), a circular shape, an elliptical (oval) shape, or the like. In order to sufficiently ensure a region for forming the through hole 35 for mounting the optical element 4 and the like around the reflective mirror portion 33, as illustrated in FIG. 3, it is advantageous that the opening portion 34a has a triangular shape (the triangular shape includes a triangular shape in which each vertex is rounded). In a case where there are a plurality of the opening portions 34a, each may have the same shape, or may have a different shape.

The optical element 4 is mounted on the upper surface of the optical waveguide 3 (upper surface of the upper cladding layer 32b). The optical element 4 includes the electrode 41 and a light emitting or receiving portion 42. Examples of the optical element 4 include, for example, a vertical cavity surface emitting laser (VCSEL) or a photodiode (PD).

In the optical element 4, the electrode 41 included in the optical element 4 and the terminal 24a located on the upper surface of the wiring board 2 (the upper surface of the build-up layer 22) are electrically connected to each other via, for example, the solder 5. The solder 5 is located at a position that does not affect the transmission and reception of light in the optical waveguide 3. As long as the electrode 41 and the solder 5 are in contact with each other, the form of contact is not limited. The electrode 41 may be, for example in a form of being in contact with the solder 5 in a state in which, the electrode 41 is inserted into the inside of the through hole 35, or may be in a form of being in contact with a surface of the solder 5 filling the through hole 35.

The light emitting or receiving portion 42 included in the optical element 4 is a member for emitting light in a case of the light emitting portion, and the emitted light is reflected by the reflective mirror portion 33 and passes through the core 31. On the other hand, it is a member for receiving light in a case of the light receiving portion, and the light passing through the core 31 is reflected by the reflective mirror portion 33 to be received by the light receiving portion. The light emitting or receiving portion 42 protrudes from the lower surface of the optical element 4 by approximately 0.5 µm or more and 10 µm or less.

The light emitting or receiving portion 42 included in the optical element 4 includes a first part 42a embedded in the upper cladding layer 32b. As a result, the optical element 4 is stably fixed to the upper cladding layer 32b by both the electrode 41 and the light emitting or receiving portion 42. Thus, even when vibration or the like occurs during use, the positional deviation of the optical element 4 is less likely to occur. As a result, transmission loss can be reduced, and stable communication can be performed. In a case where all of the light emitting or receiving portion 42 included in the optical element 4 is embedded in the surface of the upper cladding layer 32b, the inclination of the reflective mirror portion 33 may change due to the pressure at the time of embedding. Thus, the transmission loss of light may be increased between the optical element 4 and the core 31. The light emitting or receiving portion 42 includes a second part 42b located between the upper surface of the upper cladding layer 32b and the lower surface of the optical element 4. As a result, the pressure applied to the reflective mirror portion 33 can be reduced when the light emitting or receiving portion 42 is embedded, and thus a change in the inclination of the reflective mirror portion 33 can be reduced. As a result, it is possible to reduce the transmission loss of light between the optical element 4 and the core 31.

The upper cladding layer 32b does not require formation of a recessed portion for housing the light emitting or receiving portion 42, and thus the processing step is simplified. Furthermore, there is no gap between the upper cladding layer 32b and the lower surface of the light emitting or receiving portion 42, and thus mixing of foreign matter can also be reduced. Furthermore, the distance between the light emitting or receiving portion 42 and the reflective mirror portion 33 of the optical waveguide 3 is also shortened, and thus the loss of light can also be reduced.

In order to more stably fix the optical element 4 to make the positional deviation less likely to occur, the light emitting or receiving portion 42 is preferably embedded to a depth of 1% or more of the thickness of the upper cladding layer 32b. For example, in a case where the upper cladding layer 32b has a thickness of 20 µm, the light emitting or receiving portion 42 may be embedded from the surface of the upper cladding layer 32b to a depth of 0.2 µm or more.

On the other hand, in a case where the light emitting or receiving portion 42 is embedded in the upper cladding layer 32b, for example, the angle of the reflective mirror portion 33 of the optical waveguide 3 may be deformed. In order to make the angle of the reflective mirror portion 33 less likely to be deformed, the light emitting or receiving portion 42 is preferably embedded to a depth of 15% or less of the thickness of the upper cladding layer 32b. In other words, in order to make the positional deviation of the optical element 4 less likely to occur, and to make the angle of the reflective mirror portion 33 less likely to be deformed, the light emitting or receiving portion 42 is preferably embedded to a depth of 1% or more and 15% or less of the thickness of the upper cladding layer 32b.

The method for embedding the light emitting or receiving portion 42 in the upper cladding layer 32b is not limited. For example, there is a thermal compression bonding (TCB) method in which the optical element 4 is pressed against the upper cladding layer 32b while being heated. According to this method, for example, by applying a pressure of from 0.1 N to 1 N while heating the optical element 4 to 300° C. to 400° C., the surface of the upper cladding layer 32b is softened, and thus a part of the light emitting or receiving portion 42 can be embedded in the upper cladding layer 32b.

In consideration of points where the light emitting or receiving portion 42 is easily embedded in the upper cladding layer 32b, and the upper cladding layer 32b is not excessively softened to change the angle of the reflective mirror portion 33, the upper cladding layer 32b may have a Young's modulus of, for example, 0.5 GPa or more and 10 GPa or less.

Figure 4:
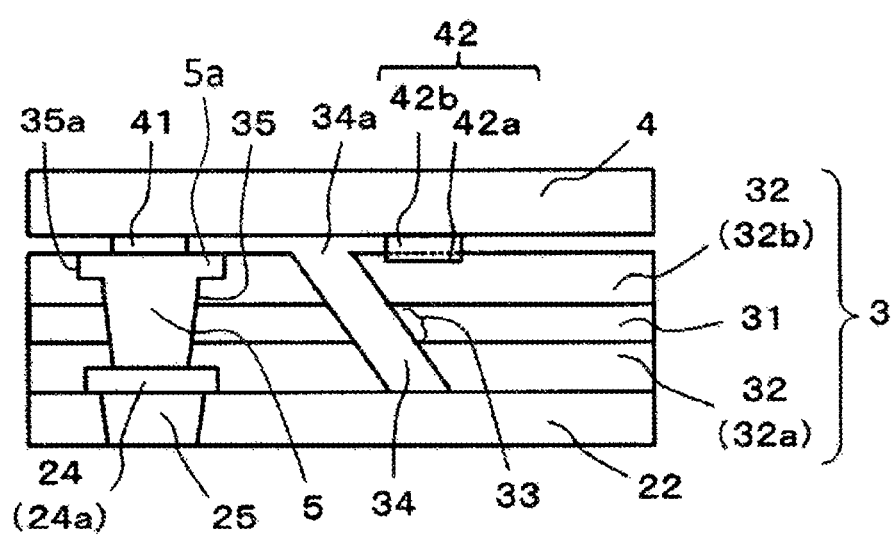
FIG. 4 is an enlarged explanatory view of the same portion as the region X illustrated in FIG. 1 in an optical element mounting module according to another embodiment of the present disclosure.

The present disclosure is not limited to the above-described examples of the embodiment, and various modifications can be made without departing from the scope of the present disclosure. As illustrated in FIG. 4, the through hole 35 of the optical waveguide 3 may include an enlarged diameter portion 35a in the upper cladding layer 32b. Thus, the solder 5 serving as the conductive material includes an enlarged diameter portion 5a in the enlarged diameter portion 35a. The enlarged diameter portion 35a is provided in order to increase the volume of the through hole 35, wherein, for example, the inner wall of the through hole 35 extends from the central axis of the through hole 35 in the horizontal direction in the upper cladding layer 32b. This is advantageous in that the solder 5 does not overflow from the through hole 35 when the electrode 41 of the optical element 4 is immersed in the melted solder 5 in the through hole 35 when mounting the optical element 4 on the optical waveguide 3. In particular, this is advantageous in a case where in order to deeply embed the light emitting or receiving portion 42 into the upper cladding layer 32b, the electrode 41 of the optical element 4 is also required to be deeply inserted into the through hole 35. In FIG. 4, the enlarged diameter portion 35a is located only in the upper cladding layer 32b, but is not limited thereto, and may be located across the lower cladding layer 32a.

Figure 5:
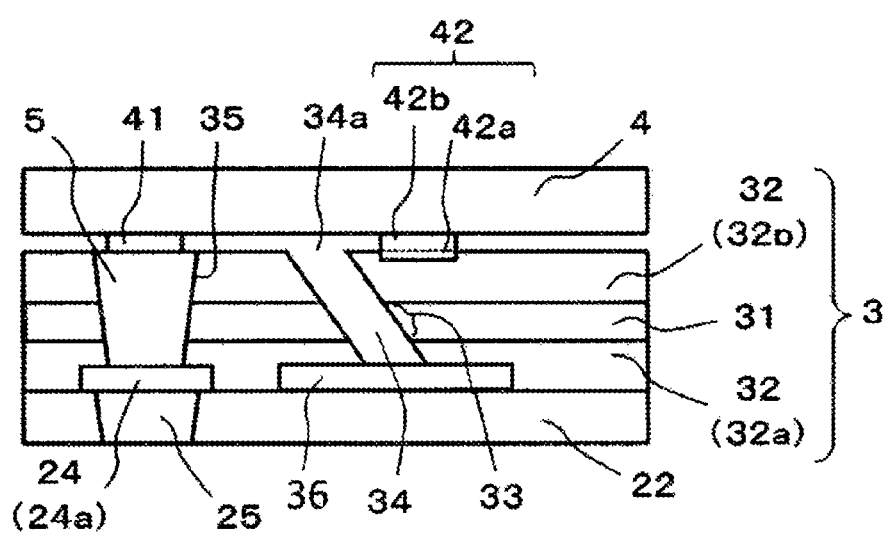
FIG. 5 is an enlarged explanatory view of the same portion as the region X illustrated in FIG. 1 in an optical element mounting module according to still another embodiment of the present disclosure.

Furthermore, as illustrated in FIG. 5, the optical waveguide 3 may be located on the upper surface of the wiring board 2 via a metal layer 36. In this case, in a case where the reflective mirror portion 33 is formed by irradiating laser light to the optical waveguide 3 to divide the core 31, the metal layer 36 located below the optical waveguide 3 functions as a shielding layer for preventing the laser light from reaching the inside of the wiring board 2. As a result, it is possible to reduce the likelihood of the laser light reaching the inside of the wiring board 2 and damaging the conductor layer 24 inside.

REFERENCE SIGNS LIST

1 Optical element mounting module
2 Wiring board
2a Upper surface
21 Core substrate
22 Build-up layer
23 Through hole conductor
24 Conductor layer
24a Terminal
25 Via hole conductor
3 Optical waveguide
31 Core layer
32 Cladding layer
32a Lower cladding layer
32b Upper cladding layer
33 Reflective mirror portion
34 Cavity
34a Opening portion
35 Through hole
35a Enlarged diameter portion
36 Metal layer
4 Optical element
4a Lower surface
41 Electrode
42 Light emitting or receiving portion
42a First part
42b Second part

The invention claimed is:

1. An optical element mounting module comprising:
a wiring board comprising an upper surface and a terminal located on the upper surface;
an optical waveguide located on the upper surface and the terminal of the wiring board; and
an optical element located on the optical waveguide and comprising an electrode and a receiving portion on a lower surface wherein,
the optical waveguide comprises:
 a lower cladding layer located on the upper surface of the wiring board,
 a core located on the lower cladding layer,
 an upper cladding layer configured to cover the lower cladding layer and the core,
 a cavity located from the upper surface of the upper cladding layer to the lower cladding layer and dividing the core, and
 a conductive material from the electrode to the terminal, and
wherein the receiving portion comprises a first part located inside the upper cladding layer and a second part located outside the upper cladding layer from the first part to the lower surface of the optical element.

2. The optical element mounting module according to claim 1, wherein
the upper cladding layer has a Young's modulus of 0.5 GPa or more and 10 GPa or less.

3. The optical element mounting module according to claim 1, wherein
the first part is located at a depth of 1% or more and 15% or less of the thickness of the upper cladding layer.

4. The optical element mounting module according to claim 1, wherein
the conductive material comprises an enlarged diameter portion in the upper cladding layer.

5. The optical element mounting module according to claim 1, wherein
the optical waveguide is located on the upper surface of the wiring board via a metal layer.

6. The optical element mounting module according to claim 1, wherein
an opening portion of the cavity in perspective plan view has a triangular shape.

7. An optical element mounting module comprising:
a wiring board comprising an upper surface and a terminal located on the upper surface;
an optical waveguide located on the upper surface and the terminal of the wiring board; and
an optical element located on the optical waveguide and comprising an electrode and a light emitting portion on a lower surface wherein,
the optical waveguide comprises:
 a lower cladding layer located on the upper surface of the wiring board,
 a core located on the lower cladding layer,
 an upper cladding layer configured to cover the lower cladding layer and the core,
 a cavity located from the upper surface of the upper cladding layer to the lower cladding layer and dividing the core, and
 a conductive material from the electrode to the terminal, and
wherein the light emitting portion comprises a first part located inside the upper cladding layer and a second part located outside the upper cladding layer from the first part to the lower surface of the optical element.

8. The optical element mounting module according to claim 7, wherein
the upper cladding layer has a Young's modulus of 0.5 GPa or more and 10 GPa or less.

9. The optical element mounting module according to claim 7, wherein
the first part is located at a depth of 1% or more and 15% or less of the thickness of the upper cladding layer.

10. The optical element mounting module according to claim 7, wherein
the conductive material comprises an enlarged diameter portion in the upper cladding layer.

11. The optical element mounting module according to claim 7, wherein
the optical waveguide is located on the upper surface of the wiring board via a metal layer.

12. The optical element mounting module according to claim 7, wherein an opening portion of the cavity in perspective plan view has a triangular shape.

* * * * *